(12) United States Patent
Zeng et al.

(10) Patent No.: US 12,256,561 B2
(45) Date of Patent: Mar. 18, 2025

(54) SiC MOSFET DEVICE AND METHOD FOR MANUFACTURING THE SAME

(71) Applicant: Shenzhen Sanrise-Tech Co., LTD, Guangdong (CN)

(72) Inventors: Dajie Zeng, Guangdong (CN); Rong Jiang, Guangdong (CN)

(73) Assignee: Shenzhen Sanrise-Tech Co., LTD, Guangdong (CN)

( * ) Notice: Subject to any disclaimer, the term of this patent is extended or adjusted under 35 U.S.C. 154(b) by 538 days.

(21) Appl. No.: 17/538,348

(22) Filed: Nov. 30, 2021

(65) Prior Publication Data
US 2022/0190104 A1   Jun. 16, 2022

(30) Foreign Application Priority Data

Dec. 14, 2020 (CN) .......................... 202011465374.2

(51) Int. Cl.
| | | |
|---|---|---|
| *H10D 62/10* | (2025.01) | |
| *H01L 21/04* | (2006.01) | |
| *H01L 21/76* | (2006.01) | |
| *H01L 21/761* | (2006.01) | |
| *H10D 12/01* | (2025.01) | |
| *H10D 30/66* | (2025.01) | |
| *H10D 62/17* | (2025.01) | |
| *H10D 62/832* | (2025.01) | |

(52) U.S. Cl.
CPC ....... *H10D 62/109* (2025.01); *H01L 21/0465* (2013.01); *H01L 21/049* (2013.01); *H01L 21/7602* (2013.01); *H01L 21/761* (2013.01); *H10D 12/031* (2025.01); *H10D 30/668* (2025.01); *H10D 62/393* (2025.01); *H10D 62/8325* (2025.01)

(58) Field of Classification Search
CPC ............... H01L 21/0465; H01L 21/049; H01L 21/7602; H01L 21/761; H01L 29/0623; H01L 29/0634; H01L 29/0878; H01L 29/1095; H01L 29/1608; H01L 29/66068; H01L 29/7802; H10D 12/031; H10D 30/668; H10D 62/109; H10D 62/393; H10D 62/8325
USPC .......................................................... 257/77
See application file for complete search history.

(56) References Cited

U.S. PATENT DOCUMENTS

2021/0083101 A1*   3/2021   Kyogoku ............ H01L 29/0878

FOREIGN PATENT DOCUMENTS

JP          2020096080 A   *   6/2020

* cited by examiner

*Primary Examiner* — Fazli Erdem
(74) *Attorney, Agent, or Firm* — Banner & Witcoff, Ltd.

(57) ABSTRACT

The present application discloses an SiC MOSFET device, including an SiC epitaxial layer in which a trench gate is formed, wherein a first bottom doped region is formed below a bottom surface of a gate trench, a second deep doped region with spacing from the gate trench is formed in the SiC epitaxial layer, the first bottom doped region is connected to a source so that voltage borne by a gate dielectric layer on the bottom surface of the gate trench is determined by gate-source voltage; the second deep doped region extends downward from a top surface of the SiC epitaxial layer, and a bottom surface of the second deep doped region is located below a bottom surface of the first bottom doped region; a top of the second deep doped region is connected to the source. The present application further discloses a method for manufacturing an SiC MOSFET device.

16 Claims, 7 Drawing Sheets

SiC MOSFET DEVICE AND METHOD FOR MANUFACTURING THE SAME

CROSS-REFERENCES TO RELATED APPLICATIONS

This application claims priority to Chinese Patent Application No. 202011465374.2 filed on Dec. 14, 2020, the disclosure of which is incorporated herein by reference in its entirety.

TECHNICAL FIELD

The present application relates to the field of semiconductor integrated circuit manufacturing, in particular to an SiC MOSFET device; the present application further relates to a method for manufacturing an SiC MOSFET device.

BACKGROUND

Compared with Si, the band gap width of SiC is close to 10 times that of silicon, and the critical breakdown electric field is also 10 times that of silicon devices. This means that under the same breakdown voltage, compared with Si devices, the width of the drift region of SiC devices is only ¹⁄₁₀ of that of Si devices, and its doping concentration may be increased by 100 times. Compared with Si devices, the drift region resistance of SiC devices may be greatly reduced. Therefore, it has great advantages in the case of high voltage, such as breakdown voltage higher than 600V. They begin to replace Si-based super-junctions and Si-based IGBT devices in more and more occasions.

SiC MOSFETs are the most likely devices to replace Si-based super-junctions and Si-based IGBTs in the range of 600V-3300V.

Although SiC MOSFETs theoretically can achieve superior performance in advance, in practice, two key problems need to be solved.

The first key problem is how to reduce the channel resistance.

In regard to channel carrier mobility, the channel carrier mobility of Si-based MOSFETs or IGBTs can be easily realized as 400 cm²/(V*s). However, for SiC devices, since there are many defects in SiC and SiO₂ interfaces, without optimization, the mobility is 10 cm²/(V*s) to 15 cm²/(V*s). Annealing in an NO environment can partially reduce some interface defects and improve the mobility to 30 cm²/(V*s) to 40 cm²/(V*s). At the same time, using the difference of mobility in different crystal directions of SiC materials, by selecting the appropriate crystal direction, the mobility can reach more than 70 cm²/(V*s) in trench MOSFETs. Unlike Si devices, SiC devices greatly reduce the resistance of the drift region. The contribution of channel resistance to it increases. The channel resistance is proportional to the channel carrier mobility and the channel length. The optimization of device structure and process is constantly improving its mobility, but there is still a big distance to silicon devices. At present, the best way to reduce the channel resistance is to reduce the channel length. Reducing the channel length needs to suppress the short channel effect of the device. Due to the higher doping concentration in the drift region, the short channel effect of SiC MOSFETs is more serious than that of Si-based devices. That is, the specific on resistance of MOSFET devices includes channel resistance and drift region resistance. Although the drift region using SiC materials can greatly reduce the drift region resistance, the SiC materials will also increase the channel resistance. Therefore, how to reduce the channel resistance has become a difficult problem to reduce the specific on resistance of devices. When reducing the channel resistance, how to overcome the short channel effect and further shorten the channel length has become the key to reducing the channel resistance.

The second key problem is how to protect the gate dielectric layer such as gate oxide.

According to the Gauss theorem, the electric field intensity of the device in the semiconductor and oxide layer complies with the following formula:

$$E_{oxide} = \left(\frac{\varepsilon_{semi}}{\varepsilon_{oxide}}\right) E_{semi}$$

where $E_{semi}$ is the critical electric field intensity of semiconductor device, $\varepsilon_{semi}$ and $\varepsilon_{oxide}$ are the dielectric constants of semiconductor material and oxide material respectively. Since the critical electric field intensity of Si and SiC is 10 times different. For Si devices, in the gate dielectric layer, that is, silica, it is difficult for the electric field intensity to exceed $3*10^6$ V*cm⁻¹. For SiC devices, when the SiC and the SiC in the interface of the insulating layer corresponding to the gate dielectric layer reach the critical electric field intensity, in the insulating layer such as silica, the electric field intensity may be as high as $9*10^6$ V*cm⁻¹, which has reached or exceeded the critical electric field intensity of silica. That is, in Si devices, when the electric field intensity in Si materials reaches the critical electric field intensity, the electric field intensity of gate oxide remains at a low value; however, in SiC devices, when the electric field intensity in SiC materials reaches the critical electric field intensity, the electric field intensity of gate oxide will reach or exceed the critical electric field intensity of gate oxide. At this time, the breakdown of gate oxide will be caused, resulting in reliability problems. Therefore, for SiC MOSFETs, using an appropriate device structure and design method to reduce the electric field intensity of the gate oxide interface during device breakdown is particularly important for the reliability of the devices.

SUMMARY

The technical problem to be solved by the present application is to provide an SiC MOSFET device, which can reduce the electric field intensity of the gate dielectric layer and the short channel effect at the same time. For this purpose, the present application further provides a method for manufacturing an SiC MOSFET device.

In order to solve the technical problem, a device unit of the SiC MOSFET device provided by the present application includes:

an SiC epitaxial layer of first conductive type doping, wherein a trench gate is formed in the SiC epitaxial layer;

the trench gate includes a gate trench, a gate dielectric layer formed on an inner side surface of the gate trench and a gate conductive material layer filled in the gate trench;

a first bottom doped region is formed in the SiC epitaxial layer below a bottom surface of the gate trench, the first bottom doped region is of second conductive type doping, and a top surface of the first bottom doped region is in contact with a bottom surface of the gate dielectric layer on the bottom surface of the gate trench;

a channel region of second conductive type doping is formed in the SiC epitaxial layer, the channel region extends downwards from a top surface of the SiC epitaxial layer, the gate conductive material layer longitudinally passes through the channel region, and a surface of the channel region covered by a side surface of the gate conductive material layer is used to form a conductive channel;

a second deep doped region of second conductive type doping is formed in the SiC epitaxial layer, and there is spacing between the second deep doped region and the gate trench;

a source region consisting of a region of first conductive type heavy doping is formed on the surface of the channel region;

a top of the gate conductive material layer is connected to a gate consisting of a front metal layer;

a top of the source region is connected to a source consisting of a front metal layer;

the first bottom doped region is connected to the source so that voltage borne by the gate dielectric layer on the bottom surface of the gate trench is determined by a voltage difference between the source and the gate to reduce electric field intensity borne by the gate dielectric layer on the bottom surface of the gate trench;

the second deep doped region extends downwards from the top surface of the SiC epitaxial layer, and a bottom surface of the second deep doped region is located below a bottom surface of the first bottom doped region;

a top of the second deep doped region is connected to the source;

the SiC epitaxial layer at a bottom of the channel region forms a drift region;

the first bottom doped region and the second deep doped region increase depletion of the drift region at the bottom of the channel region between the first bottom doped region and the second deep doped region to reduce depletion between the channel region and the drift region at the bottom to reduce a short channel effect.

In some cases, the SiC epitaxial layer is formed on an SiC substrate, the SiC substrate is of first conductive type heavy doping, and a drain region consists of the thinned SiC substrate or is formed after backside ion implantation on the thinned SiC substrate;

a drain consisting of a back metal layer is formed on a back surface of the drain region;

when the SiC MOSFET device works, with the increase of the voltage of the drain, the drift region at the bottom of the channel region between the first bottom doped region and the second deep doped region forms a pinch-off structure.

In some cases, the depth of the second deep doped region is greater than the implantation depth of an ion implantation machine;

the SiC epitaxial layer is formed by superimposing a plurality of SiC epitaxial sub-layers, and the second deep doped region is formed by connecting a plurality of deep doped sub-regions formed in each SiC epitaxial sub-layer through ion implantation of second conductive type doping.

In some cases, the SiC MOSFET device is formed by a plurality of the device units connected in parallel;

in a top view, the device units are in a strip-shaped structure or polygonal structure;

the polygonal structure includes square or hexagon.

In some cases, the SiC epitaxial layer is formed by superimposing two SiC epitaxial sub-layers, and the second deep doped region is formed by connecting two deep doped sub-regions;

a second SiC epitaxial sub-layer is superimposed on a top surface of a first SiC epitaxial sub-layer, a first deep doped sub-region is formed in the first SiC epitaxial sub-layer, and a second deep doped sub-region is formed in the second SiC epitaxial sub-layer and passes through the second SiC epitaxial sub-layer.

In some cases, the device units are in a strip-shaped structure, the gate trench is strip-shaped, the channel region is formed outside the two side surfaces corresponding to long sides of the gate trench, and the second deep doped region is formed outside the two side surfaces corresponding to the long sides of the gate trench.

In some cases, the first deep doped sub-region and the second deep doped sub-region are in a strip-shaped structure parallel to the gate trench; the second deep doped sub-region is superimposed on and in contact with a top surface of the first deep doped sub-region.

In some cases, the width of the second deep doped sub-region is equal to the width of the first deep doped sub-region;

or the width of the second deep doped sub-region is greater than the width of the first deep doped sub-region to reduce the specific on resistance of the device;

or the width of the second deep doped sub-region is less than the width of the first deep doped sub-region to improve pinch-off of the channel region.

In some cases, the second deep doped sub-region is in a strip-shaped structure parallel to the gate trench, and the first deep doped sub-region is in a strip-shaped structure perpendicular to the gate trench;

bottoms of the first deep doped sub-region and the second deep doped sub-region transversely intersect and are in contact;

the first bottom doped region and the first deep doped sub-region are in contact and are connected to the source through a top of the second deep doped sub-region.

In some cases, an arrangement pitch of the strip-shaped structure of the second deep doped sub-region and an arrangement pitch of the strip-shaped structure of the first deep doped sub-region are independent of each other.

In some cases, the SiC epitaxial layer has an uneven doping concentration, and the doping concentration near the top surface is higher than the doping concentration near the bottom surface to reduce spreading resistance and reduce a JFET effect.

In some cases, an anti-JFET implantation region is further formed in the drift region between the gate trench at the bottom of the channel region and the second deep doped region.

In some cases, the anti-JFET implantation region is formed by vertical implantation from the top surface of the SiC epitaxial layer to the bottom of the channel region;

or the anti-JFET implantation region is formed by angular implantation after the formation of the gate trench and before the formation of the gate dielectric layer.

In some cases, the SiC MOSFET device is an N-type device, the first conductive type is N-type, and the second conductive type is P-type.

In some cases, a P-type doping impurity includes aluminum, an N-type doping impurity includes nitrogen, and the material of the front metal layer includes TiNiAl.

In some cases, the maximum depth of the second deep doped region is more than 1.6 microns.

In order to solve the technical problem, in the method for manufacturing the SiC MOSFET device in the present application, a step of forming the second deep doped region includes:

step 1: forming a first SiC epitaxial sub-layer on the SiC substrate;

step 2: defining a forming region of a first deep doped sub-region, and performing second conductive type ion implantation to form the first deep doped sub-region in the first SiC epitaxial sub-layer;

step 3: forming a second SiC epitaxial sub-layer on a surface of the first SiC epitaxial sub-layer;

step 4: defining a forming region of a second deep doped sub-region, and performing second conductive type ion implantation to form the second deep doped sub-region passing through the second SiC epitaxial sub-layer in the second SiC epitaxial sub-layer;

repeating the process of forming the second SiC epitaxial sub-layer in step 3 and the process of forming the second deep doped sub-region in step 4 to form more SiC epitaxial sub-layers and deep doped sub-regions, wherein the SiC epitaxial layer is formed by superimposing the first SiC epitaxial sub-layer, the second SiC epitaxial sub-layer and each SiC epitaxial sub-layer on the top of the second SiC epitaxial sub-layer, and the second deep doped region is formed by superimposing the first deep doped sub-region, the second deep doped sub-region and each deep doped sub-region on the top of the second deep doped sub-region.

In some cases, in step 2, a first photoresist pattern formed by photoresist is used to define the forming region of the first deep doped sub-region, the first photoresist pattern is used as a mask for ion implantation in the first deep doped sub-region, and the first photoresist pattern is removed after ion implantation in the first deep doped sub-region;

in step 4, a second photoresist pattern formed by photoresist is used to define the forming region of the second deep doped sub-region, the second photoresist pattern is used as a mask for ion implantation in the second deep doped sub-region, and the second photoresist pattern is removed after ion implantation in the second deep doped sub-region;

or in step 2, a first hard mask pattern is used to define the forming region of the first deep doped sub-region, the first hard mask pattern is used as a mask for ion implantation in the first deep doped sub-region, and the first hard mask pattern is removed after ion implantation in the first deep doped sub-region;

in step 4, a second hard mask pattern is used to define the forming region of the second deep doped sub-region, the second hard mask pattern is used as a mask for ion implantation in the second deep doped sub-region, and the second hard mask pattern is removed after ion implantation in the second deep doped sub-region.

In some cases, a process of forming the trench gate includes:

forming a third hard mask pattern on the surface of the SiC epitaxial layer, the third hard mask pattern opening the forming region of the gate trench and covering a region outside the forming region of the gate trench;

performing etching by using the third hard mask pattern as a mask to form the gate trench;

performing comprehensive ion implantation to form the first bottom doped region at the bottom of the gate trench;

forming the gate dielectric layer on the inner side surface of the gate trench;

filling the gate conductive material layer into the gate trench.

The gate structure of the device unit of the SiC MOSFET device provided by the present application adopts a trench gate. On this basis, a first bottom doped region at the bottom of the gate trench is arranged, and the first bottom doped region is connected to the source. In this way, the voltage of the gate dielectric layer at the bottom of the gate trench is determined by the voltage difference between the gate conductive material layer and the source, that is, the gate-source voltage, the gate source voltage is a small value, which is only greater than the threshold voltage when the device is on and the gate source voltage is 0V when the device is off. Compared with the larger gate-drain voltage, the present application can greatly reduce the voltage on the gate dielectric layer at the bottom of the gate trench, thus reducing the electric field intensity of the gate dielectric layer, well protecting the gate dielectric layer in the interface structure where the gate dielectric layer is in contact with the SiC epitaxial layer, and improving the reliability of the device.

At the same time, in the present application, a second deep doped region is arranged in the SiC epitaxial layer, there is spacing between the second deep doped region and the gate trench, the second deep doped region is also connected to the source, and the first bottom doped region and the second deep doped region are of second conductive type doping. In this way, the first bottom doped region and the second deep doped region can increase the depletion of the drift region at the bottom of the channel region, and the depletion between the channel region and the drift region at the bottom can be reduced, thus reducing the short channel effect. The reason is that the short channel effect is that, when the drift region depletes the channel region, the channel region near the drain will produce a pinch-off effect, the length of the pinched-off channel region is equivalently out of control of the gate voltage, and the length of the pinched-off channel region is the shortened length of the channel region. In the present application, the depletion of the drift region at the bottom of the channel region can be increased through the first bottom doped region and the second deep doped region, and the depletion of the channel region and the bottom drift region will be reduced, that is, the region of the channel region depleted by the bottom drift region becomes smaller. If pinch-off occurs, the drift region at the bottom of the channel region will be pinched off through the first bottom doped region and the second deep doped region, thus reducing the length of the pinched-off region of the channel region, and reducing the short channel effect.

In the present application, since the short channel effect can be reduced, the length of the channel region can be further shortened and the channel resistance can be reduced. In addition, the drift region consisting of the SiC epitaxial layer can greatly reduce the resistance of the drift region of the device, and finally the specific on resistance of the device can be further reduced.

BRIEF DESCRIPTION OF THE DRAWINGS

The present application will be further described in detail below in combination with the specific embodiments and with reference to the drawings.

DETAILED DESCRIPTION OF THE DISCLOSURE

Embodiment 1 of the present application provides an SiC MOSFET device.

Figure 1:
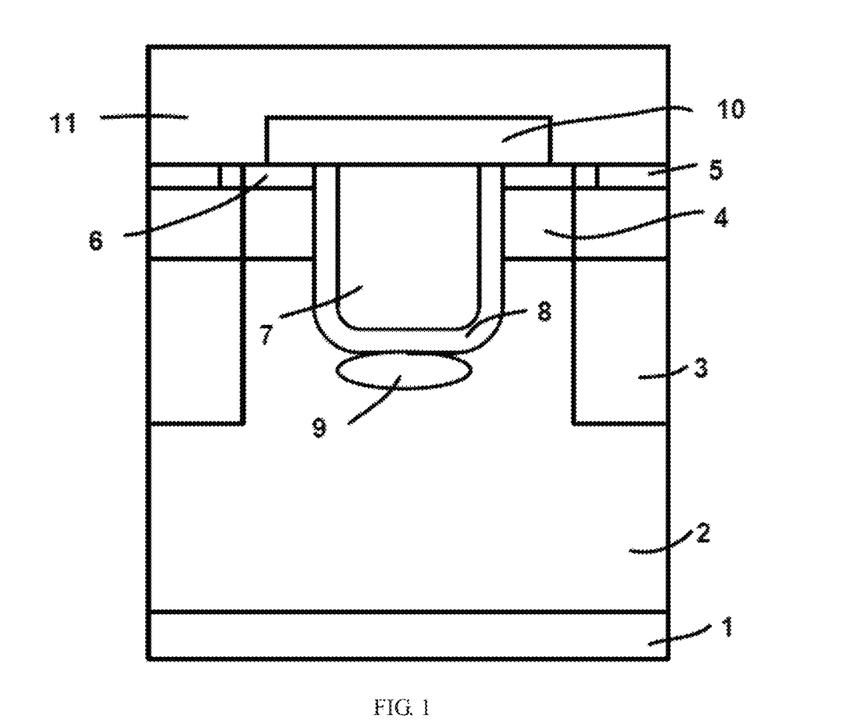
FIG. 1 illustrates a schematic diagram of a sectional structure of a device unit of an SiC MOSFET device according to embodiment 1 of the present application.
Figure 2:
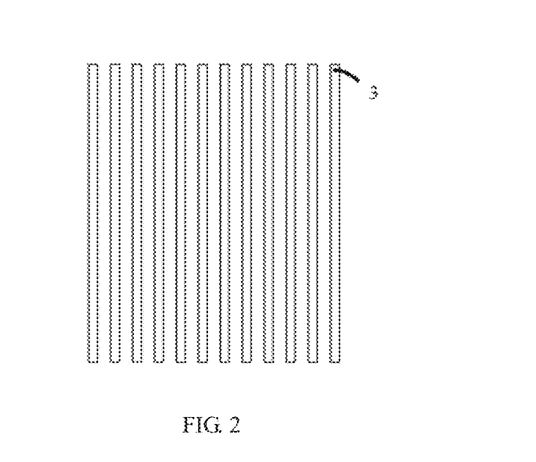
FIG. 2 illustrates a layout of a second deep doped region of the SiC MOSFET device according to embodiment 1 of the present application.

Referring to FIG. 1, it illustrates a schematic diagram of a sectional structure of a device unit of the SiC MOSFET device according to embodiment 1 of the present application. Referring to FIG. 2, it illustrates a layout of a second deep doped region 3 of the SiC MOSFET device according to embodiment 1 of the present application. A device unit of the SiC MOSFET device according to embodiment 1 of the present application includes:

an SiC epitaxial layer 2 of first conductive type doping, wherein a trench gate is formed in the SiC epitaxial layer 2.

The trench gate includes a gate trench, a gate dielectric layer 8 formed on an inner side surface of the gate trench and a gate conductive material layer 7 filled in the gate trench. The gate dielectric layer 8 usually is a gate oxide layer. The gate conductive material layer 7 usually is a polysilicon gate.

A first bottom doped region 9 is formed in the SiC epitaxial layer 2 below a bottom surface of the gate trench, the first bottom doped region 9 is of second conductive type doping, and a top surface of the first bottom doped region 9 is in contact with a bottom surface of the gate dielectric layer 8 on the bottom surface of the gate trench.

A channel region 4 of second conductive type doping is formed in the SiC epitaxial layer 2, the channel region 4 extends downwards from a top surface of the SiC epitaxial layer 2, the gate conductive material layer 7 longitudinally passes through the channel region 4, and a surface of the channel region 4 covered by a side surface of the gate conductive material layer 7 is used to form a conductive channel.

A second deep doped region 3 of second conductive type doping is formed in the SiC epitaxial layer 2, and there is spacing between the second deep doped region 3 and the gate trench.

A source region 5 consisting of a region of first conductive type heavy doping is formed on the surface of the channel region 4.

A top of the gate conductive material layer 7 is connected to a gate consisting of a front metal layer 11.

A top of the source region 6 is connected to a source consisting of a front metal layer 11.

The first bottom doped region 9 is connected to the source so that voltage borne by the gate dielectric layer 8 on the bottom surface of the gate trench is determined by a voltage difference between the source and the gate to reduce electric field intensity borne by the gate dielectric layer 8 on the bottom surface of the gate trench.

The second deep doped region 3 extends downwards from the top surface of the SiC epitaxial layer 2, and a bottom surface of the second deep doped region 3 is located below a bottom surface of the first bottom doped region 9.

A top of the second deep doped region 3 is connected to the source.

The SiC epitaxial layer 2 at a bottom of the channel region 4 forms a drift region.

The first bottom doped region 9 and the second deep doped region 3 increase depletion of the drift region at the bottom of the channel region 4 between the first bottom doped region 9 and the second deep doped region 3 to reduce depletion between the channel region 4 and the drift region at the bottom to reduce a short channel effect.

In embodiment 1 of the present application, the SiC epitaxial layer 2 is formed on an SiC substrate 1, the SiC substrate 1 is of first conductive type heavy doping, and a drain region consists of the thinned SiC substrate 1 or is formed after backside ion implantation on the thinned SiC substrate 1.

a drain consisting of a back metal layer is formed on a back surface of the drain region.

Figure 3:
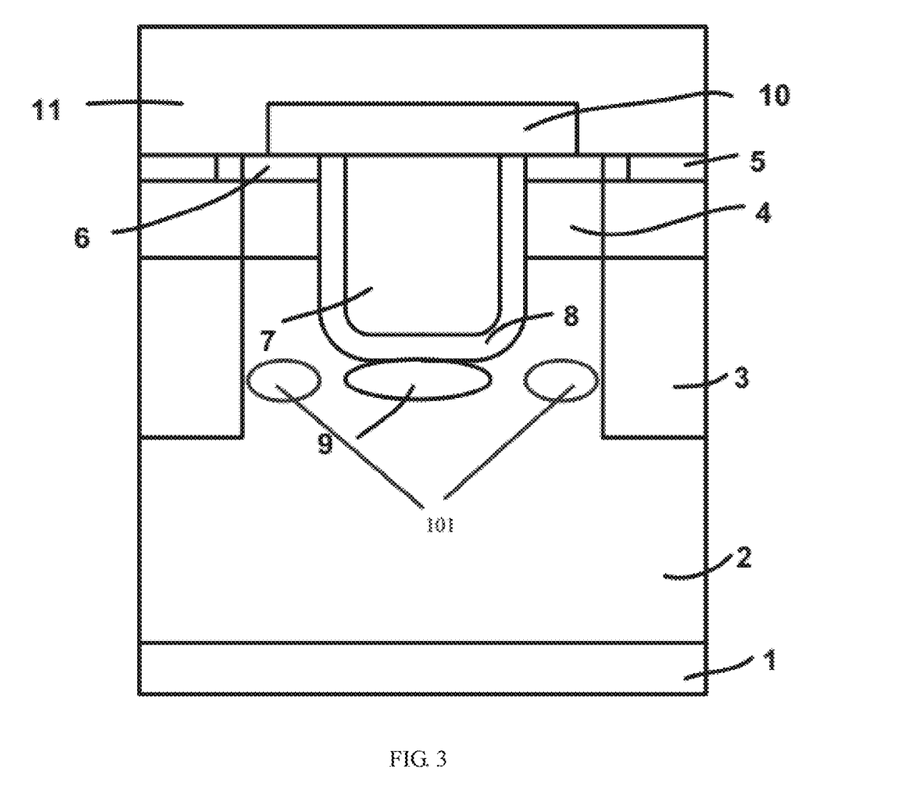
FIG. 3 illustrates a schematic diagram of a position of a pinch-off structure formed in a drift region by a first bottom doped region and a second deep doped region of the structure illustrated in FIG. 1.

When the SiC MOSFET device works, with the increase of the voltage of the drain, the drift region at the bottom of the channel region 4 between the first bottom doped region 9 and the second deep doped region 3 forms a pinch-off structure. Referring to FIG. 3, it illustrates a schematic diagram of a position of a pinch-off structure formed in the drift region by the first bottom doped region 9 and the second deep doped region 3 of the structure illustrated in FIG. 1. The pinch-off structure is a structure in which the drift region in the region corresponding to reference sign 101 is completely depleted by the first bottom doped region 9 and the second deep doped region 3. Since the drift region and the first bottom doped region 9 of second conductive type doping and the second deep doped region 3 are depleted by each other, the depletion ability of the drift region to the channel region 4 of second conductive type doping is weakened. Since the depleted part of the channel region 4 by the drift region is equivalent to no longer belonging to the part controlled by the gate voltage, that is, no channel is formed, the length of the channel region 4 depleted by the drift region is reduced, equivalently the effective length of the channel region 4 is protected, that is, the short channel effect is reduced.

In embodiment 1 of the present application, the depth of the second deep doped region 3 is greater than the implantation depth of an ion implantation machine.

The SiC epitaxial layer 2 is formed by superimposing a plurality of SiC epitaxial sub-layers, and the second deep doped region 3 is formed by connecting a plurality of deep doped sub-regions formed in each SiC epitaxial sub-layer through ion implantation of second conductive type doping.

The SiC MOSFET device is formed by a plurality of the device units connected in parallel.

Generally, in embodiment 1 of the present application, the first bottom doped region 9 needs to extend to a transition region or terminal region outside a device unit region, contact the second deep doped region 3 in the transition region or terminal region, and be connected to the source through a contact formed in the second deep doped region 3 and the top of the source region 6. The contact passes through an interlayer film 10. An ohmic contact region 5 of second conductive type heavy doping is also formed at the bottom of the contact in the top of the source region 6.

In a top view, the device units are in a strip-shaped structure or polygonal structure.

For the strip-shaped structure, although the top view surface of the strip-shaped structure is ultimately a rectangle, the strip-shaped structure forms a conductive channel only on the two sides of the length side of the trench gate of the strip-shaped structure, and the width side of the trench gate of the strip-shaped structure does not form a conductive channel and usually extends outside the device unit region, the strip-shaped structure will be arranged in only one direction, that is, along the width direction of the strip-shaped structure.

For the polygonal structure, the polygonal structure will be arranged in two dimensions in transverse and longitudinal directions.

The polygonal structure includes square or hexagon.

The maximum depth of the second deep doped region 3 is more than 1.6 microns.

In an exemplary embodiment, the depth of the second deep doped region 3 is 1.6 microns. Since the depth of the second deep doped region 3 is greater than the implantation depth of the ion implantation machine, the maximum value of which is about 1 micron, the second deep doped region 3 may be realized by superimposing through two times of ion implantation, that is, the SiC epitaxial layer 2 is formed by superimposing two SiC epitaxial sub-layers, and the second deep doped region 3 is formed by connecting two deep doped sub-regions.

Figure 7A:
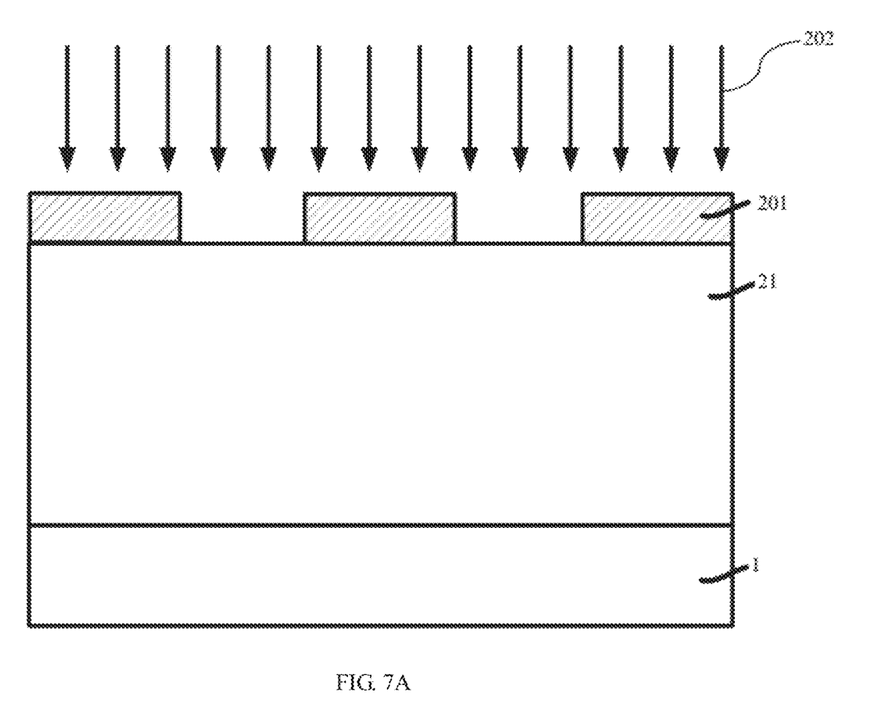
FIG. 7A to FIG. 7C illustrate schematic diagrams of device structures in each step of a process of forming a second deep doped region in a method for manufacturing the SiC MOSFET device according to embodiment 1 of the present application.
Figure 7B:
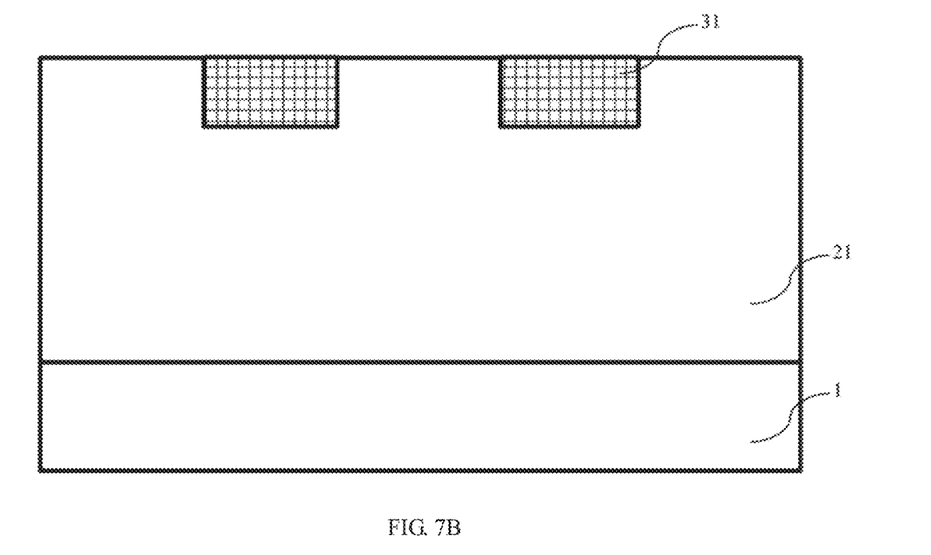
Figure 7C:
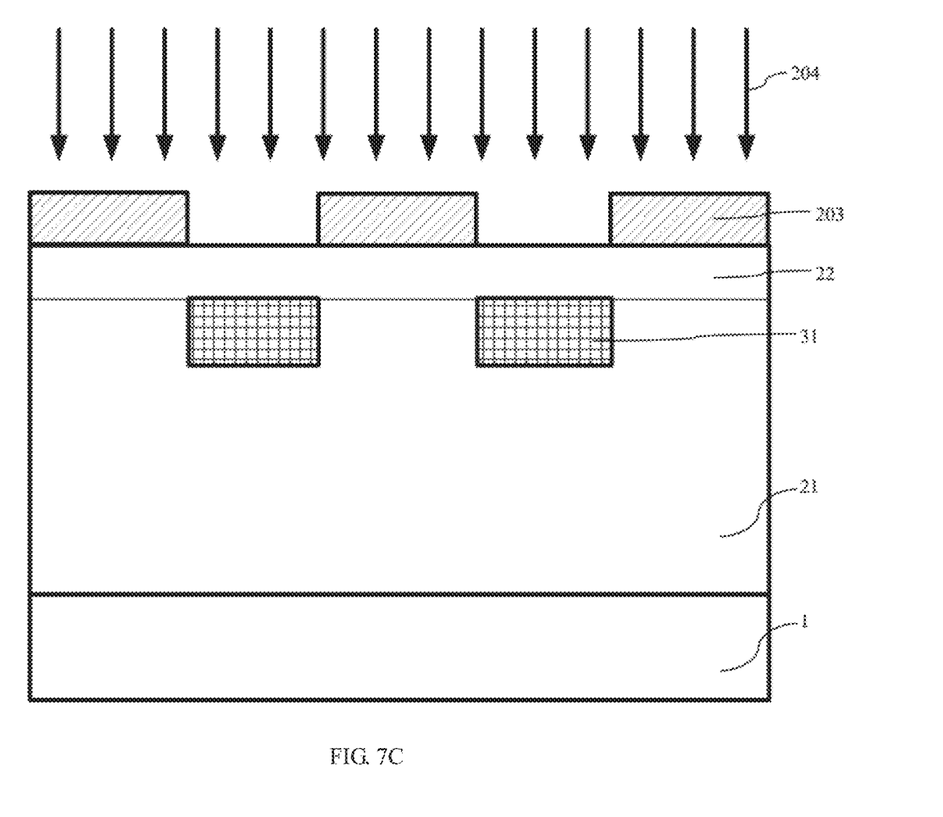

Please refer to FIG. 7C. The second SiC epitaxial sub-layer 22 is superimposed on the top surface of the first SiC epitaxial sub-layer 21, the first deep doped sub-region 31 is formed in the first SiC epitaxial sub-layer 21, and the second deep doped sub-region 32 is formed in the second SiC epitaxial sub-layer 22 and passes through the second SiC epitaxial sub-layer 22.

In an exemplary embodiment, the device units are in a strip-shaped structure, the gate trench is strip-shaped, the channel region 4 is formed outside the two side surfaces corresponding to the long sides of the gate trench, and the second deep doped region 3 is formed outside the two side surfaces corresponding to the long sides of the gate trench.

The first deep doped sub-region 31 and the second deep doped sub-region 32 are in a strip-shaped structure parallel to the gate trench; the second deep doped sub-region 32 is superimposed on and in contact with a top surface of the first deep doped sub-region 31. Referring to FIG. 2, the strip-shaped structure of the first deep doped sub-region 31 and the second deep doped sub-region 32 is the same as the strip-shaped structure of the second deep doped region 3 illustrated in FIG. 2, and the width of the second deep doped sub-region 32 is equal to the width of the first deep doped sub-region 31. In other embodiments, the width of the second deep doped sub-region 32 may also be greater than the width of the first deep doped sub-region 31 to reduce the specific on resistance of the device. Alternatively, the width of the second deep doped sub-region 32 is less than the width of the first deep doped sub-region 31 to improve pinch-off of the channel region 4.

In embodiment 1 of the present application, the SiC epitaxial layer 2 has uneven doping concentration, and the doping concentration near the top surface is higher than the doping concentration near the bottom surface to reduce spreading resistance and reduce a JFET effect.

Figure 4:
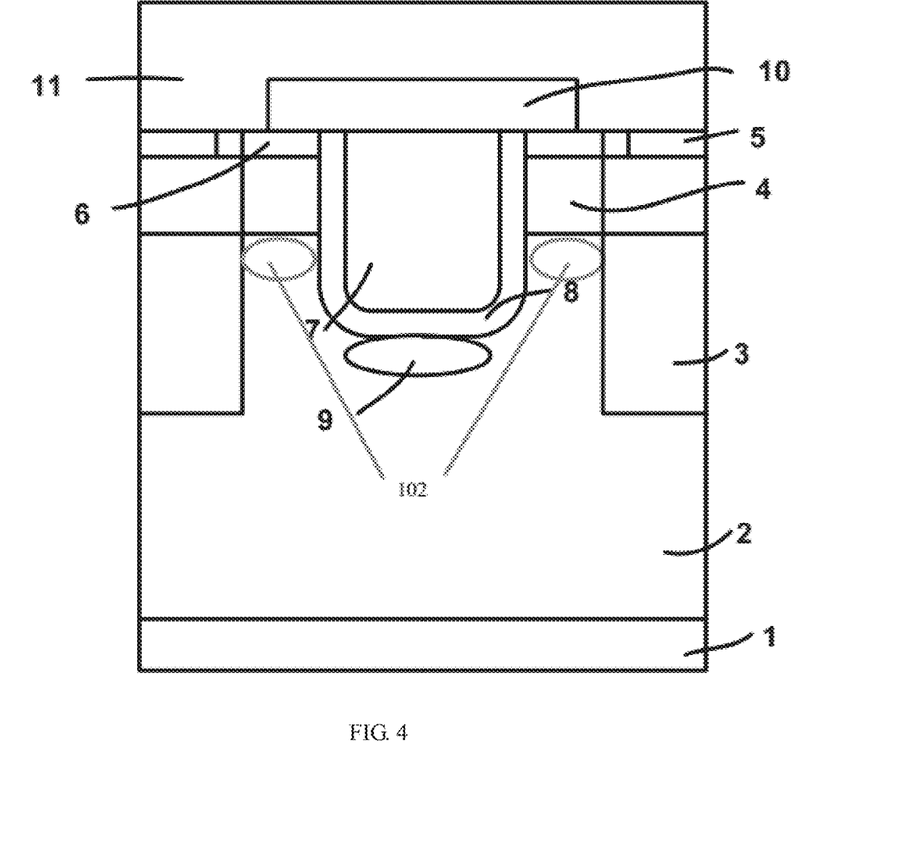
FIG. 4 illustrates a schematic diagram of a position of an anti-JFET implantation region formed in the structure illustrated in FIG. 1.

In other embodiments, reducing the JFET effect may also be realized by using an anti-JFET implantation region. For example, an anti-JFET implantation region is further formed in the drift region between the gate trench at the bottom of the channel region 4 and the second deep doped region 3. Referring to FIG. 4, it is a schematic diagram of a position of an anti-JFET implantation region formed in the structure illustrated FIG. 1. A region corresponding to reference sign 102 is the anti-JFET implantation region. The anti-JFET implantation region is of first conductive type doping and can prevent JFET pinch-off, thus reducing the resistance at the anti-JFET implantation region. The anti-JFET implantation region is formed by vertical implantation from the top surface of the SiC epitaxial layer 2 to the bottom of the channel region 4. Alternatively, the anti-JFET implantation region is formed by angular implantation after the formation of the gate trench and before the formation of the gate dielectric layer 8.

In embodiment 1 of the present application, the SiC MOSFET device is an N-type device, the first conductive type is N-type, and the second conductive type is P-type. A P-type doping impurity includes aluminum, an N-type doping impurity includes nitrogen, and the material of the front metal layer 11 includes TiNiAl.

The gate structure of the device unit of the SiC MOSFET device according to embodiment 1 of the present application adopts a trench gate. On this basis, a first bottom doped region 9 at the bottom of the gate trench is arranged, and the first bottom doped region 9 is connected to the source. In this way, the voltage of the gate dielectric layer 8 at the bottom of the gate trench is determined by the voltage difference between the gate conductive material layer 7 and the source, that is, the gate-source voltage, the gate source voltage is a small value, which is only greater than the threshold voltage when the device is on and the gate source voltage is 0V when the device is off. Compared with the larger gate-drain voltage, embodiment 1 of the present application can greatly reduce the voltage on the gate dielectric layer 8 at the bottom of the gate trench, thus reducing the electric field intensity of the gate dielectric layer 8, well protecting the gate dielectric layer 8 in the interface structure where the gate dielectric layer 8 is in contact with the SiC epitaxial layer 2, and improving the reliability of the device.

At the same time, in embodiment 1 of the present application, a second deep doped region 3 is arranged in the SiC epitaxial layer 2, there is spacing between the second deep doped region 3 and the gate trench, the second deep doped region 3 is also connected to the source, and the first bottom doped region 9 and the second deep doped region 3 are of second conductive type doping. In this way, the first bottom doped region 9 and the second deep doped region 3 can increase the depletion of the drift region at the bottom of the channel region 4, and the depletion between the channel region 4 and the drift region at the bottom can be reduced, thus reducing the short channel effect. The reason is that the short channel effect is that, when the drift region depletes the channel region 4, the channel region 4 near the drain will produce a pinch-off effect, the length of the pinched-off channel region 4 is equivalently out of control of the gate voltage, and the length of the pinched-off channel region 4 is the shortened length of the channel region 4. In embodiment 1 of the present application, the depletion of the drift region at the bottom of the channel region 4 can be increased through the first bottom doped region 9 and the second deep doped region 3, and the depletion of the channel region 4 and the bottom drift region will be reduced, that is, the region of the channel region 4 depleted by the bottom drift region becomes smaller. If pinch-off occurs, the drift region at the bottom of the channel region 4 will be pinched off through the first bottom doped region 9 and the second deep doped region 3, thus reducing the length of the pinched-off region of the channel region 4, and reducing the short channel effect.

In embodiment 1 of the present application, since the short channel effect can be reduced, the length of the channel region 4 can be further shortened and the channel resistance can be reduced. In addition, the drift region consisting of the SiC epitaxial layer 2 can greatly reduce the resistance of the drift region of the device, and finally the specific on resistance of the device can be further reduced.

The device according to embodiment 1 of the present application will be further described below in combination with specific parameters.

An SiC substrate 1 is different from a Si substrate. At present, the lowest resistivity that can be achieved by the SiC substrate is around 0.02 Ω*cm. However, at present, the lowest resistivity of the Si substrate can be less than 1 mΩ*cm. Besides, the SiC substrate is more difficult to thin than the Si substrate. Therefore, the substrate resistance of the SiC MOSFET is greater than that of the Si-based device.

The gate dielectric layer 8 is usually silicon dioxide, which can be oxidized at high temperature in the process, the temperature is usually between 1150° C. and 1250° C., or it may be deposited through CVD. The thickness of the oxide layer is usually about 50 nm.

The channel region 4 is usually formed through aluminum ion implantation.

The heavily doped source region 6 is usually formed through nitrogen ion implantation.

The thickness of the interlayer film 10 is usually about 1 μm and usually consists of two layers of silica. A typical condition is PSG+BPSG The greatest features of the device according to embodiment 1 of the present application are as follows:

There is a layer of the second deep doped region 3, which may also be called DP layer (Deep P Type Implant) when it is p-type. It requires a great junction depth, and the typical condition is 1.6 μm. For the existing ion implantation machine, the highest implantation energy is usually 900 keV and the corresponding depth is 1.0 μm. The ion implantation machine cannot realize it. Therefore, ion implantation+epitaxy of epitaxial layer+ion implantation is adopted to realize in the process.

At the bottom of the gate trench, there is a first bottom doped region 9, which may also be called Bot_P (Bottom P Type Implant) when it is p-type. It is connected to the source through the second deep doped region 3 in the layout. Since the junction depth of the second deep doped region 3 is greater than that of the first bottom doped region 9, the connection can be well realized on the layout.

By adding Bot_P at the bottom of the gate trench, since the potential at the bottom is 0, it can well reduce the electric field intensity at the bottom of the gate trench, thus well protecting the gate oxide.

DP and Bot_P form a structure together. They are connected to the source. With the increase of drain voltage, a good pinch-off can be formed at the position corresponding to reference sign 101 in FIG. 3. This pinch-off can well reduce the depletion by the drift region to the channel, reduce the short channel effect, and reduce the length of the channel.

The cell, i.e., the device unit, may be designed to be strip-shaped. The advantage of the strip shape is that the process is simple, but the channel density is low under the same pitch. Therefore, a square or polygonal cell structure may also be used to increase the channel density.

The following introduction will be made mainly by taking strip-shaped cell as an example.

A typical structure of this device is as follows:

The depth of the gate trench is 0.9 μm, the opening width of the gate trench is 1.0 μm, and the distance between gate trenches is 5.0 μm.

The depth corresponding to the first bottom doped region 9 reaches 0.2 μm below the trench.

The depth corresponding to the heavily doped source region 6 is 0.2 μm.

The corresponding depth of the channel region 4 is 0.6 μm, and the corresponding length of the channel region 4 is 0.4 μm.

The depth of the second deep doped region 3 is 1.6 μm, and the width of the second deep doped region 3 is 2.0 μm.

The following introduction will be made by taking a 1200V SiC MOSFET as an example. The thickness of the SiC epitaxial layer 2 adopted by a typical 1200V SiC MOSFET is 12 μm, and the corresponding doping concentration of the SiC epitaxial layer 2 is 8e15 cm$^{-3}$.

In embodiment 1 of the present application, in order to form a Deep P, i.e., the second deep doped region 3, it cannot be realized through ion implantation alone. Therefore, this Deep P is realized through ion implantation and epitaxy. Since in embodiment 1 of the present application, the depth corresponding to Deep P is 1.6 μm, it can be formed by one time of ion implantation+epitaxy+one time of ion implantation. If it is expected that the depth of Deep p is greater, or the maximum energy that can be implanted by the ion implantation machine at a single time is limited, Deep P may needs to be formed through two times of epitaxy+three times of ion implantation.

Figure 5:
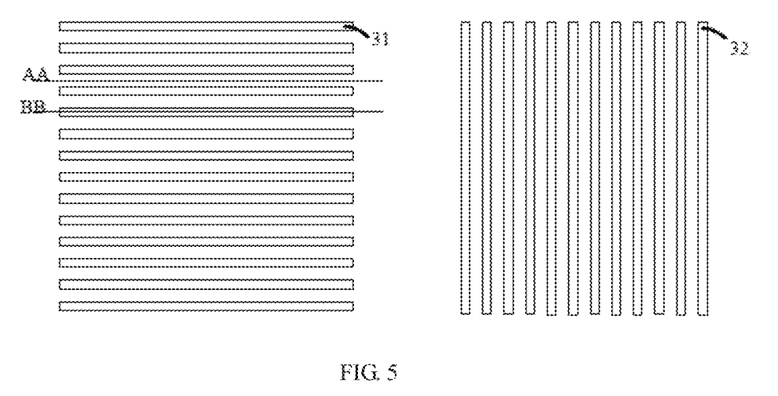
FIG. 5 illustrates a layout of a first bottom doped region and a second deep doped region of an SiC MOSFET device according to embodiment 2 of the present application.
Figure 6A:
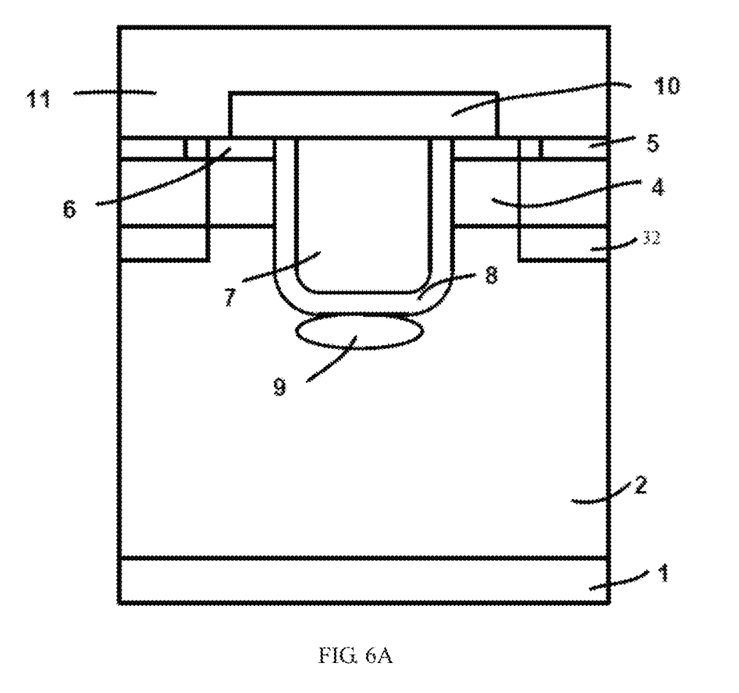
FIG. 6A illustrates a schematic diagram of a sectional structure of a device unit of the SiC MOSFET device according to embodiment 2 of the present application along line AA in FIG. 5.
Figure 6B:
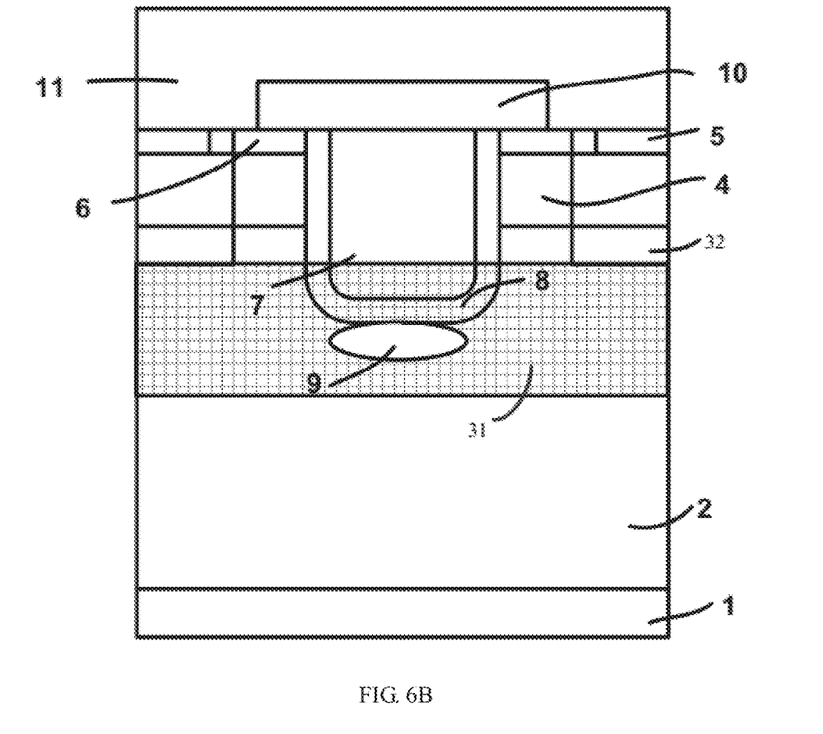
FIG. 6B illustrates a schematic diagram of a sectional structure of a device unit of the SiC MOSFET device according to embodiment 2 of the present application along line BB in FIG. 5.

An SiC MOSFET device according to embodiment 2 of the present application is as follows:

The difference between the SiC MOSFET device according to embodiment 2 of the present application and the SiC MOSFET device according to embodiment 1 of the present application is that the SiC MOSFET device according to embodiment 2 of the present application has the following features:

Referring to FIG. 5, it illustrates a layout of a first bottom doped region and a second deep doped region of the SiC MOSFET device according to embodiment 2 of the present application. Referring to FIG. 6A, it illustrates a schematic diagram of a sectional structure of a device unit of the SiC MOSFET device according to embodiment 2 of the present application along line AA in FIG. 5. Referring to FIG. 6B, it illustrates a schematic diagram of a sectional structure of a device unit of the SiC MOSFET device according to embodiment 2 of the present application along line BB in FIG. 5. The second deep doped sub-region 32 is in a strip-shaped structure parallel to the gate trench, and the first deep doped sub-region 31 is in a strip-shaped structure perpendicular to the gate trench. In other words, in a top view, the strip-shaped structures of the second deep doped sub-region 32 and the first deep doped sub-region 31 are perpendicular. The second deep doped sub-region 32 needs to be arranged according to the arrangement of the strip-shaped structure of the gate trench. The pitch of the second deep doped sub-regions 32, that is, the width and spacing of the strip-shaped structures, is consistent with the pitch of the gate trench. However, the arrangement pitch of the strip-shaped structures of the second deep doped sub-regions 32 and the arrangement pitch of the strip-shaped structures of the first deep doped sub-regions 31 are independent of each other.

Bottoms of the first deep doped sub-region 31 and the second deep doped sub-region 32 transversely intersect and are in contact.

The first bottom doped region 9 and the first deep doped sub-region 31 are in contact and are connected to the source through a contact formed in a top of the second deep doped sub-region 32. In other words, compared with embodiment 1 of the present application, the contact between the first bottom doped region 9 and the second deep doped region 3 can be realized in the device unit region.

Referring to FIG. 7A to FIG. 7C, they illustrate schematic diagrams of device structures in each step of a process of forming the second deep doped region in a method for manufacturing the SiC MOSFET device according to embodiment 1 of the present application. In the method for manufacturing the SiC MOSFET device according to embodiment 1 of the present application, the step of forming the second deep doped region 3 includes the following steps:

In step 1, referring to FIG. 7A, a first SiC epitaxial layer 21 is formed on the SiC substrate 1.

In step 2, referring to FIG. 7A, a forming region of a first deep doped sub-region 31 is defined, and second conductive type ion implantation corresponding to reference sign 202 is performed to form the first deep doped sub-region 31 in the first SiC epitaxial sub-layer 21. The formed first deep doped sub-region 31 is as illustrated in FIG. 7B.

In the method according to embodiment 1 of the present application, in step 2, a first photoresist pattern 201 formed by photoresist is used to define the forming region of the first deep doped sub-region 31, the first photoresist pattern 201 is used as a mask for ion implantation in the first deep doped sub-region 31, and the first photoresist pattern 201 is removed after ion implantation in the first deep doped sub-region 31.

In the method of other embodiments, in step 2, a first hard mask pattern may be used to define the forming region of the first deep doped sub-region 31, the first hard mask pattern is used as a mask for ion implantation in the first deep doped sub-region 31, and the first hard mask pattern is removed after ion implantation in the first deep doped sub-region 31. The first hard mask pattern may be formed by firstly forming a first hard mask layer, for example, by adopting silicon oxide or silicon nitride, and then performing photolithographic definition and etching the first hard mask layer.

In step 3, referring to FIG. 7C, a second SiC epitaxial sub-layer 22 is formed on a surface of the first SiC epitaxial sub-layer 21.

In step 4, referring to FIG. 7C, a forming region of a second deep doped sub-region 32 is defined, and second conductive type ion implantation corresponding to reference sign 204 is performed to form the second deep doped sub-region 32 passing through the second SiC epitaxial sub-layer 22 in the second SiC epitaxial sub-layer 22.

In the method according to embodiment 1 of the present application, in step 4, a second photoresist pattern 203 formed by photoresist is used to define the forming region of the second deep doped sub-region 32, the second photoresist pattern 203 is used as a mask for ion implantation in the second deep doped sub-region 32, and the second photoresist pattern 203 is removed after ion implantation in the second deep doped sub-region 32.

In the method according to other embodiments, in step 4, a second hard mask pattern may be used to define the forming region of the second deep doped sub-region 32, the second hard mask pattern is used as a mask for ion implantation in the second deep doped sub-region 32, and the second hard mask pattern is removed after ion implantation in the second deep doped sub-region 32.

The process of forming the second SiC epitaxial sub-layer 22 in step 3 and the process of forming the second deep doped sub-region 32 in step 4 are repeated to form more SiC epitaxial sub-layers and deep doped sub-regions, the SiC epitaxial layer 2 is formed by superimposing the first SiC epitaxial sub-layer 21, the second SiC epitaxial sub-layer 22 and each SiC epitaxial sub-layer on the top of the second SiC epitaxial sub-layer 22, and the second deep doped region 3 is formed by superimposing the first deep doped sub-region 31, the second deep doped sub-region 32 and each deep doped sub-region on the top of the second deep doped sub-region 32.

In the method according to embodiment of the present application, after the SiC epitaxial layer 2 is formed, a process of forming the trench gate is performed. The process of forming the trench gate includes the following steps:

A third hard mask pattern is formed on the surface of the SiC epitaxial layer 2, and the third hard mask pattern opens the forming region of the gate trench and covers a region outside the forming region of the gate trench.

Etching is performed by using the third hard mask pattern as a mask to form the gate trench.

Comprehensive ion implantation is performed to form the first bottom doped region 9 at the bottom of the gate trench.

The gate dielectric layer 8 is formed on the inner side surface of the gate trench.

The gate conductive material layer 7 is filled into the gate trench.

On the basis of forming the first bottom doped region 9 and the second deep doped region 3, the subsequent forming process of the SiC MOSFET according to embodiment 1 of the present application or the SiC MOSFET according to embodiment 2 of the present application is the same as the existing process.

The method for manufacturing the device according to embodiment of the present application will be further described below in combination with specific parameters.

The thickness of the first SiC epitaxial sub-layer 21 is 11.2 μm, and the resistivity of the epitaxial layer is 8e15 $cm^{-3}$.

According to the temperature corresponding to ion implantation 202, if it is normal-temperature implantation, the pattern structure 201 is usually formed by busing photoresist directly. If it is high-temperature implantation, since high-temperature implantation can better repair the defects of the lattice, silica may be used as a hard mask layer to replace the photoresist pattern 201. Then, ion implantation is performed.

After that, the thickness of the formed second SiC epitaxial sub-layer 22 is 0.8 μm, and the corresponding doping concentration is 8e15 $cm^{-3}$, which is the same as that of the first layer. More preferably, in order to reduce the spreading resistance of the MOSFET, the doping concentration for epitaxy of this layer may be increased to 2.0e16 $cm^{-3}$.

Then a second time of photolithography and ion implantation 204 is performed.

In this way, DP is formed through two times of ion implantation and epitaxy. The formation of Bot_P is relatively simple. After the gate trench of the device is formed and under the situation the hard mask layer of the gate trench still exists, Bot_P is formed in a mesa through ordinary implantation under the blocking effect of the hard mask layer of the gate trench.

Please note that masks are required for these two times of ion implantation.

When forming the device according to embodiment 1 of the present application illustrated in FIG. 1, the masks used for the two times of ion implantation 203 and 204 may be exactly the same, and the mask corresponding to the layout of the second deep doped region 3 corresponding to FIG. 2 is used. One possible way is that the width of the second deep doped region 3 is 2 μm, and the spacing between the second deep doped regions 3 is 3 μm.

The masks used for ion implantation 203 and 204 may also be different, if it desired that the formed second deep doped region 3 is relatively wide near the top and narrow at the bottom of the device, thus reducing the specific on resistance of the device, such that the width of the second deep doped sub-region 32 is greater than that of the first deep doped sub-region 31; or if it is desired that the formed DP is relatively wide near the bottom and narrow at the top of the device, thus helping to pinch off the channel, such that the width of the first deep doped sub-region 31 is greater than that of the second deep doped sub-region 32.

Of course, for the strip-shaped structure, the first deep doped sub-region 31 and the second deep doped sub-region 32 may also be in different directions. For example, when forming the device according to embodiment 2 of the present application corresponding to FIG. 5 to FIG. 6B, it is necessary to adopt the structure in which the strip-shaped structures of the layout of the first deep doped sub-region 31 and the second deep doped sub-region 32 illustrated in FIG. 5 are perpendicular to each other. This structure has the following advantages:

Deep P Implant and Bot_P can be connected directly in the cell region, and it is not needed to connect Deep P Implant to Bot_P in the transition region or terminal of the chip as the previous structure.

Since the first deep doped sub-region 31 is directly at the bottom of the gate trench at some positions, the dose of Bot_P Implant may be reduced, thus partially reducing the JFET effect caused by Bot_P Implant.

Since the pitch of the mask of the first deep doped sub-region 31, i.e., the pitch of the strip-shaped structure of the layout, brings about very great flexibility, it can be designed according to the needs. The pitch may be smaller or greater than the pitch of the mask of the second deep doped sub-region 32.

This structure can well reduce the electric field intensity of the gate dielectric layer 8, reduce the depletion of the channel region by forming pinch-off, and well reduce the short channel effect.

However, the device will bring about a very serious JFET effect.

Usually there are several following solutions to reduce the JFET effect:

The doping concentration of the SiC epitaxial layer 2 is not uniform, but the doping concentration near the top is increased. Taking a 1200V SiC MOSFET as an example, for the SiC epitaxial layer 2 with a thickness of 12 μm, the thickness of the bottom may be 10.5 μm and the adopted doping concentration is 8e15 cm$^{-3}$, while the thickness of the top is 1.5 μm and the adopted doping concentration is 2e16 cm$^{-3}$.

It may also be implanted by adopting high-energy Anti-JFET Implant, that is, high-energy nitrogen is implanted in a region marked by reference sign 102 in FIG. 4.

The position of Anti-JFET Implant is located below the channel region 4. This may be done with or without a mask. In practice, implantation with a mask is usually required.

After the gate trench is formed, P-type implantation such as aluminum implantation may also be performed at the bottom of the gate trench to form the first bottom doped region 9. Then, angular N-type implantation such as nitrogen implantation may be performed on the sidewall of the gate trench to increase the doping concentration of the sidewall, so as to reduce the spreading resistance.

Under the actual situation, the corresponding designers may choose an appropriate solution according to the needs to reduce the JFET effect.

The present application has been described above in detail through specific embodiments, which, however, do not constitute restrictions on the present application. Without departing from the principle of the present application, those skilled in the art may also make many modifications and improvements, which should also be regarded as falling within the scope of protection of the present application.

What is claimed is:

1. An SiC MOSFET device, wherein a device unit comprises:

an SiC epitaxial layer of a first conductive type doping, wherein a trench gate is formed in the SiC epitaxial layer;

the trench gate comprises a gate trench, a gate dielectric layer formed on an inner side surface of the gate trench, and a gate conductive material layer filled in the gate trench;

a first bottom doped region is formed in the SiC epitaxial layer below a bottom surface of the gate trench, the first bottom doped region is of a second conductive type doping, and a top surface of the first bottom doped region is in contact with a bottom surface of the gate dielectric layer on the bottom surface of the gate trench;

a channel region of the second conductive type doping is formed in the SiC epitaxial layer, the channel region extends downwards from a top surface of the SiC epitaxial layer, the gate conductive material layer longitudinally passes through the channel region;

a second deep doped region of the second conductive type doping is formed in the SiC epitaxial layer, and there is spacing between the second deep doped region and the gate trench;

a source region consisting of a region of first conductive type heavy doping is formed on a surface of the channel region;

a top of the gate conductive material layer is connected to a gate consisting of a front metal layer;

a top of the source region is connected to a source consisting of a front metal layer;

the first bottom doped region is connected to the source;

the second deep doped region extends downwards from the top surface of the SiC epitaxial layer, and a bottom surface of the second deep doped region is located below a bottom surface of the first bottom doped region;

a top of the second deep doped region is connected to the source;

the SiC epitaxial layer at a bottom of the channel region forms a drift region; and the SiC epitaxial layer is composed of multiple layers of SiC epitaxial sub-layers, each of which is stacked together vertically, a deep doped sub-region is formed in each of the SiC epitaxial sub-layers, and the deep doped sub-regions are stacked together vertically, and the second deep doped region is composed of the deep doped sub-regions in each layer.

2. The SiC MOSFET device according to claim 1, wherein the SiC epitaxial layer is formed on an SiC substrate, the SiC substrate is of first conductive type heavy doping, and a drain region consists of thinned SiC substrate or is formed after backside ion implantation on the thinned SiC substrate; and a drain consisting of a back metal layer is formed on a back surface of the drain region.

3. The SiC MOSFET device according to claim 2, wherein a depth of the second deep doped region is greater than an implantation depth of an ion implantation machine.

4. The SiC MOSFET device according to claim 3, wherein the SiC MOSFET device is formed by a plurality of the device units connected in parallel; and in a top view, the device units are in a strip-shaped structure or polygonal structure, wherein the polygonal structure comprises a square or a hexagon.

5. The SiC MOSFET device according to claim 4, wherein the SiC epitaxial layer is composed of two layers of SiC epitaxial sub-layers, and the second deep doped region is composed of two layers of the deep doped sub-regions, a bottom surface of a second SiC epitaxial sub-layer is in contact with a top surface of a first SiC epitaxial sub-layer, a first deep doped sub-region is located in the first SiC epitaxial sub-layer, and a second deep doped sub-region is located in the second SiC epitaxial sub-layer, the second deep doped sub-region vertically passes through the second SiC epitaxial sub-layer, and the bottom surface of the second deep doped sub-region is in contact with the first deep doped sub-region.

6. The SiC MOSFET device according to claim 5, wherein the device units are in a strip-shaped structure, the gate trench is strip-shaped, the channel region is formed outside two side surfaces corresponding to long sides of the gate trench, and the second deep doped region is formed outside the two side surfaces corresponding to the long sides of the gate trench.

7. The SiC MOSFET device according to claim 6, wherein the first deep doped sub-region and the second deep doped sub-region are in a strip-shaped structure parallel to the gate trench, and wherein the second deep doped sub-region is superimposed on and in contact with a top surface of the first deep doped sub-region.

8. The SiC MOSFET device according to claim 7, wherein a width of the second deep doped sub-region is equal to a width of the first deep doped sub-region;

or the width of the second deep doped sub-region is greater than the width of the first deep doped sub-region;

or the width of the second deep doped sub-region is less than the width of the first deep doped sub-region.

9. The SiC MOSFET device according to claim 6, wherein the second deep doped sub-region is in a strip-shaped structure parallel to the gate trench, and the first deep doped sub-region is in a strip-shaped structure perpendicular to the gate trench;

bottoms of the first deep doped sub-region and the second deep doped sub-region transversely intersect and are in contact; and the first bottom doped region and the first deep doped sub-region are in contact and are connected to the source through a top of the second deep doped sub-region.

10. The SiC MOSFET device according to claim 9, wherein an arrangement pitch of the strip-shaped structure of the second deep doped sub-region and an arrangement pitch of the strip-shaped structure of the first deep doped sub-region are independent of each other.

11. The SiC MOSFET device according to claim 1, wherein the SiC epitaxial layer has an uneven doping concentration, and a doping concentration near the top surface is higher than a doping concentration near the bottom surface.

12. The SiC MOSFET device according to claim 1, wherein an anti-JFET implantation region is further formed in the drift region between the gate trench at the bottom of the channel region and the second deep doped region.

13. The SiC MOSFET device according to claim 12, wherein the anti-JFET implantation region is formed by vertical implantation from the top surface of the SiC epitaxial layer to the bottom of the channel region;

or the anti-JFET implantation region is formed by angular implantation after formation of the gate trench and before formation of the gate dielectric layer.

14. The SiC MOSFET device according to claim 1, wherein the SiC MOSFET device is an N-type device, the first conductive type is N-type, and the second conductive type is P-type.

15. The SiC MOSFET device according to claim 14, wherein a P-type doping impurity comprises aluminum, an N-type doping impurity comprises nitrogen, and a material of the front metal layer comprises TiNiAl.

16. The SiC MOSFET device according to claim 1, wherein a maximum depth of the second deep doped region is more than 1.6 microns.

* * * * *